United States Patent [19]
Wolkstein

[11] 4,105,948
[45] Aug. 8, 1978

[54] FREQUENCY SYNTHESIZER WITH RAPIDLY CHANGEABLE FREQUENCY

[75] Inventor: Herbert J. Wolkstein, Livingston, N.J.

[73] Assignee: RCA Corporation, New York, N.Y.

[21] Appl. No.: 788,328

[22] Filed: Apr. 18, 1977

[51] Int. Cl.² .......................................... H03B 3/04
[52] U.S. Cl. ..................................... 331/14; 331/16; 331/179
[58] Field of Search ............... 331/1 A, 14, 16, 17, 331/179, 10

[56] References Cited

U.S. PATENT DOCUMENTS

| | | | |
|---|---|---|---|
| 3,286,191 | 11/1966 | Cornwell | 331/14 |
| 3,568,083 | 3/1971 | Harzer | 331/1 A |
| 3,579,281 | 5/1971 | Kam | 331/1 A |
| 3,651,422 | 3/1972 | Underhill | 331/1 A |
| 3,676,794 | 7/1972 | Bidell et al. | 331/1 A |
| 3,965,438 | 6/1976 | Winston | 331/1 A |
| 4,030,045 | 6/1977 | Clark | 331/1 A |

OTHER PUBLICATIONS

D. J. Malone, "Gear-Shifted Phase-Locked Osc." IBM Tech. Disc. Bul. vol. 14, No. 9, Feb. 1972.

*Primary Examiner*—John Kominski
*Attorney, Agent, or Firm*—H. Christoffersen; Samuel Cohen; Carl V. Olson

[57] ABSTRACT

A frequency synthesizer capable of rapidly changing to a different desired output frequency includes a voltage-controlled oscillator and a variable frequency divider arranged in a phase-locked loop. A first frequency-control voltage is initially applied to the voltage-controlled oscillator to cause a rapid change in its output frequency toward a desired value. Then, the divisor of the variable frequency divider is changed to produce a second frequency-control voltage which precisely sets and maintains the oscillator output frequency at the desired value.

5 Claims, 1 Drawing Figure

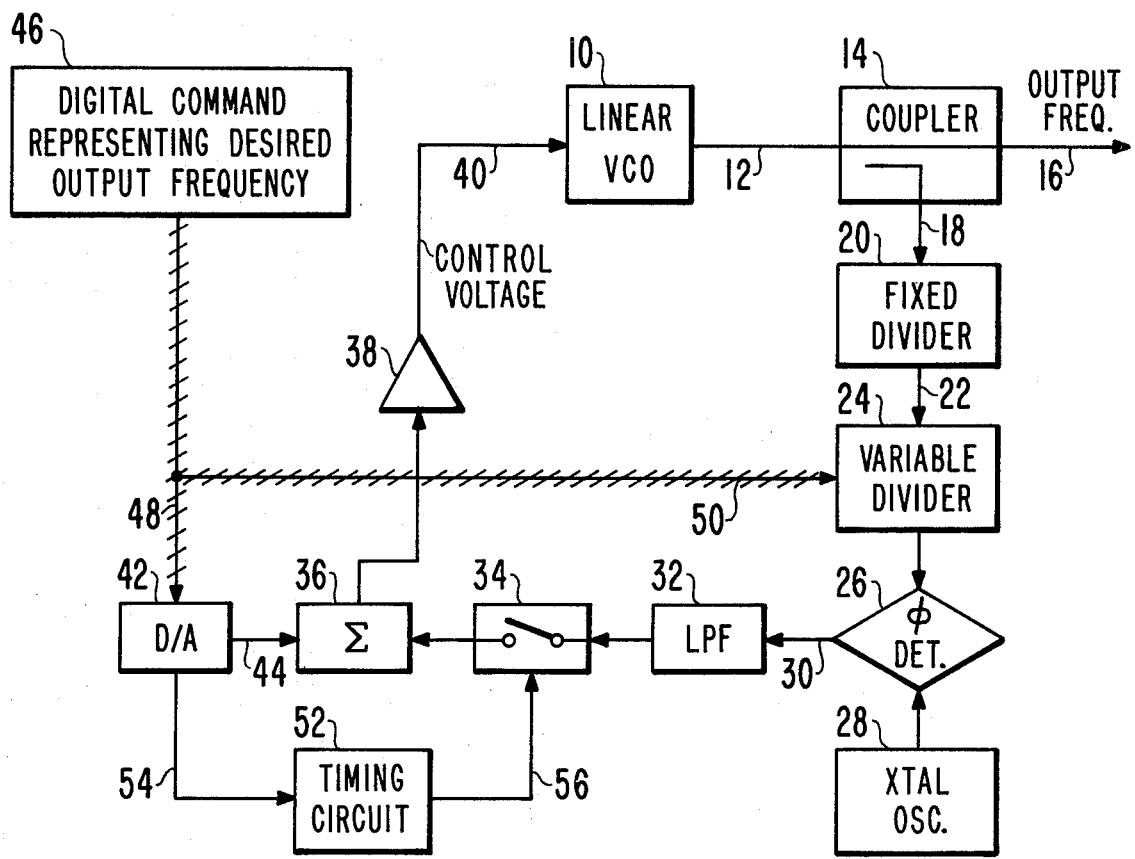

FREQUENCY SYNTHESIZER WITH RAPIDLY CHANGEABLE FREQUENCY

Microwave frequency synthesizers for accurate generation of desired output frequencies are in wide use in the commercial and military communications fields. Both of two basic methods for effecting frequency signal synthesis use a crystal-controlled oscillator as the basic reference frequency, and both are digitally programmable in small frequency increments. A direct method uses algebraic manipulation of the reference frequency to produce the output frequency. This results in a frequency synthesizer having limited bandwidth, using complex filtering, and being relatively expensive. An indirect method which uses a programmable phase-locked loop for controlling and maintaining a desired output frequency, is relatively low in cost, covers a wide bandwidth, but is relatively slow in responding to a command to change the output frequency of the synthesizer to a desired different frequency value. This limitation of frequency synthesizers including a phase-locked loop makes them unsuitable for use in applications where a very rapid change from one output frequency to another desired output frequency is required. Accordingly, there is a need for a frequency synthesizer having all of the advantages of the phase-locked loop type of synthesizer and having, in addition, the advantage of very rapidly responding to a command to change its output frequency from one value to another desired value.

In accordance with a feature or aspect of the present invention, a frequency synthesizer of the phase-locked loop type is made capable of more rapidly changing its output from one frequency value to another by applying an initial suitable frequency-control voltage to the voltage-controlled oscillator.

In the drawing:

The sole FIG. of the drawing is a block diagram of a frequency synthesizer constructed according to the teachings of the invention.

The frequency synthesizer includes a linearized voltage-controlled oscillator 10 which is constructed to have a substantially linear relationship between the voltage of a control signal applied to the oscillator and the resulting output frequency of the oscillator. An example of a suitable commercially-available unit for use in the box 10 is a Type MC 1648 linearized voltage-controlled oscillator manufactured by the Motorola Semiconductor Company. The output at 12 of the oscillator 10 is applied through a directional coupler 14 to an output frequency signal line 16. A small portion of the output signal from the oscillator 10 is coupled over a path 18 to a fixed frequency divider 20. The divider 20 may be a Motorola Type MC 1678 frequency divider unit having a constant divisor of 10. The output of the fixed divider 20 is applied over a path 22 to a variable frequency divider 24, which may be an RCA Type CD 4516 programmable frequency divider providing frequency division by divisors in the range from 2 to 16.

The output of the variable divider 24 is applied to one input of a phase detector 26, which may be an RCA Type CD 4046 phase comparator manufactured by RCA Corporation. The other output of the phase detector 26 is supplied from an harmonic crystal oscillator 28, which may be a Motorola Type MC 12060 crystal oscillator having the frequency of 1 MHz.

The output of line 30 from the phase detector 26 is passed through a conventional low-pass filter 32, through a series electronic switch 34, and through a voltage summing circuit 36 and a driver amplifier 38 to the control voltage input 40 of the linearized voltage-controlled oscillator 10. The portion of the drawing which has thus far been described, with the exception of the switch 34 and the voltage summing circuit 36, constitutes a conventional known frequency synthesizer of the phase-locked loop type, which provides an output frequency determined by the divisor set into the variable divider 24.

The frequency synthesizer shown also includes a digital-to-analog converter 42 providing an output voltage at 44 which is applied through the voltage summing circuit 36 and the amplifier 38 as a control voltage at the input 40 of oscillator 10 for controlling the frequency of the oscillator. The digital-to-analog converter 42 may be a Model DAC-H18B high speed converter manufactured by Datel Systems, Inc., of Canton, Massachusetts.

A source 46 of a digital command representing a desired output frequency is applied over a multiconductor line 48 to the digital input of digital-to-analog converter 42, and is also simultaneously applied over multiconductor line 50 to the digital input of variable divider 24. A timing circuit 52 receives signals over line 54 from the digital-to-analog converter 42, and provides signals over line 56 controlling the operation of the switch 34. The timing circuit 52 may include a differentiator circuit to produce a pulse in response to an initial change in the output from the converter 42, and may include a monostable multivibrator triggered by the pulse from the differentiator to cause an opening of electronic switch 34, and operative after a predetermined time period to return the switch 34 to its closed condition.

The operation of the frequency synthesizer will be described starting from the condition in which 34 is closed and an output frequency signal is provided at 16 having a value determined by the digital output of the frequency command unit 46. When a different output frequency is desired, a digital command representing a desired output frequency is conveyed from the source 46 to the digital-to-analog converter 42 and to the variable divider 24. The digital signal may consist of four binary digits (bits) on four respective conductors so that the binary signal represents a number from 1 to 16. The binary number applied to the variable divider 24 causes the variable divider to divide the frequency of the received signal by a corresponding number 1 through 16. If the fixed divider divides the frequency received from the oscillator 10 by the fixed number 10, then the total frequency division of signals applied to the phase detector 26 is by one of the divisors 10, 20, 30 . . . 160. The output frequency at 16 then can be any discrete value from 10 through 160 MHz in increments of 10 MHz when the crystal oscillator 28 has an output frequency of 1.0 MHz.

The phase detector 26 produces a control voltage for the voltage-controlled oscillator 10. However, the control voltage path is interrupted by the switch 34, which is opened by action of the timing circuit 52 when a new digital command is applied to the digital-to-analog converter 42.

The digital command applied from unit 46 to the digital-to-analog converter 42 similarly consists of four bits representing a number between 1 and 16. This digital number is translated to a voltage of corresponding relative amplitude which voltage, when applied over path 44, 36, 38 and 40 to the oscillator 10, causes the oscillator to very rapidly change its output frequency to a specific frequency between 10 and 160 MHz in increments of 10 MHz in accordance with the value 1 through 16 of the digital signal applied to converter 42. The corresponding analog signal applied from the digital-to-analog converter 42 to the voltage-controlled oscillator 10 causes a very rapid change in the output frequency of the oscillator to a value near the desired value. Digital-to-analog converters are commonly capable of providing analog outputs after very short intervals, such as 20 nanoseconds after the digital input signal is applied thereto. As a result, the oscillator 10 is very rapidly changed in frequency toward the desired frequency.

The timing circuit 52 opens switch 34 immediately when a digital command is applied to the D/A converter 42, and the timing circuit closes the switch 34 at a short time thereafter when the voltage-controlled oscillator has been adjusted to provide an output at or near the desired frequency. When the switch 34 is closed, the phase-locked loop is completed and rendered operative to generate a second control voltage applied over path 30, 32, 34, 36, 38 and 40 to the voltage-controlled oscillator 10. This second control voltage is effective to pull the oscillator frequency to the exact desired output frequency, and to thereafter maintain the output frequency at the desired value. In this way, it is seen that the desired output frequency of the frequency synthesizer is very quickly reached after initiation of the digital command, and is thereafter very accurately maintained by the phase-locked loop.

The described frequency synthesizer circuit is useful, to give another example, in the 4 through 8 GHz frequency band. Any frequency in increments of 1 MHz may be selected with an accuracy of about 10 KHz, and the changing from one desired output frequency to another can be accomplished in less than 200 nanoseconds.

What is claimed is:

1. A frequency synthesizer capable of rapidly changing its output frequency from one value to another value, comprising
   a phase locked loop including a voltage-controlled oscillator, a phase detector, a variable-frequency divider coupling an output of the voltage-controlled oscillator to an input of the phase detector, a source of a reference oscillation coupled to the other input of the phase detector, and a path for a first control voltage from the output of the phase detector to the control input of the voltage-controlled oscillator,
   a source of an output frequency command signal coupled to the control input of said variable-frequency divider,
   converter means responsive to said output frequency command signal to apply a corresponding second control voltage to the control input of said voltage-controlled oscillator, and
   timing and switch means responsive to a change in said desired output frequency command signal to momentarily interrupt said path for the first control voltage.

2. A frequency synthesizer according to claim 1 wherein said voltage-controlled oscillator is linearized so that the frequency output of the oscillator varies linearly with the value of control voltage applied thereto.

3. A frequency synthesizer according to claim 1 wherein said first and second control voltages are applied through a summing circuit to said voltage-controlled oscillator.

4. A frequency synthesizer according to claim 1 wherein said converter means to apply said second control voltage to the voltage-controlled oscillator includes a digital-to-analog converter, and said output frequency command signal is a digital signal.

5. A frequency synthesizer according to claim 4 wherein the divisor of said variable frequency divider is controlled by said output frequency command digital signal.

* * * * *